(12) United States Patent
Haga et al.

(10) Patent No.: US 8,231,735 B2
(45) Date of Patent: Jul. 31, 2012

(54) POLISHING SLURRY FOR CHEMICAL MECHANICAL POLISHING AND METHOD FOR POLISHING SUBSTRATE

(75) Inventors: Kouji Haga, Hitachi (JP); Yuto Ootsuki, Hitachi (JP); Yasushi Kurata, Hitachi (JP); Kazuhiro Enomoto, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 191 days.

(21) Appl. No.: 11/905,279

(22) Filed: Sep. 28, 2007

(65) Prior Publication Data
US 2008/0176982 A1    Jul. 24, 2008

Related U.S. Application Data

(62) Division of application No. 10/524,064, filed as application No. PCT/JP03/10001 on Aug. 6, 2003, now Pat. No. 7,311,855.

(30) Foreign Application Priority Data

Aug. 9, 2002   (JP) ................. P2002-233702
Mar. 6, 2003   (JP) ................. P2002-059280

(51) Int. Cl.
H01L 21/304    (2006.01)
(52) U.S. Cl. ............ 134/7; 134/6; 134/34; 134/36; 436/692; 436/693
(58) Field of Classification Search .......... None
See application file for complete search history.

(56) References Cited

U.S. PATENT DOCUMENTS

| | | | |
|---|---|---|---|
| 5,532,191 A | 7/1996 | Nakano et al. | |
| 6,383,239 B1 | 5/2002 | Suzuki et al. | |
| 6,936,543 B2 | 8/2005 | Schroeder et al. | |
| 2001/0009840 A1 | 7/2001 | Orii et al. | |
| 2002/0028636 A1* | 3/2002 | Koichi et al. | 451/41 |
| 2003/0168627 A1* | 9/2003 | Singh et al. | 252/79.1 |
| 2003/0228762 A1* | 12/2003 | Moeggenborg et al. | 438/691 |
| 2005/0126080 A1 | 6/2005 | Kon et al. | |

FOREIGN PATENT DOCUMENTS

| | | |
|---|---|---|
| EP | 0 897 744 A1 | 2/1999 |
| JP | 05-326469 A | 12/1993 |
| JP | 06-310503 A | 11/1994 |
| JP | 07-188087 A | 7/1995 |
| JP | 09-168966 A | 6/1997 |
| JP | 09-270402 A | 10/1997 |
| JP | 2001-023938 A | 1/2001 |
| JP | 2001-031954 A | 2/2001 |
| JP | 2001-185514 A | 7/2001 |
| JP | 2001-200244 A | 7/2001 |
| JP | 2002-134444 A | 5/2002 |
| JP | 2002-203819 A | 7/2002 |
| JP | 2002-294222 A | 10/2002 |
| JP | 2003-128910 A | 5/2003 |
| JP | 2003-168660 A | 6/2003 |
| WO | 02-061008 A2 | 8/2002 |

OTHER PUBLICATIONS

Japanese Office Action dated Apr. 24, 2009 (mailing date), issued in corresponding Japanese Patent Application No. 2004-527345.
Chinese Office Action dated Feb. 24, 2010, issued in corresponding Chinese Patent Application No. 200710001563.2
Torajiro Honma et al. "Effect of Various Factors on Grinding Using Jet Mill", Chemical Industrial Paper Collection, vol. 6, No. 5, 1980.
International Search Report dated Oct. 14, 2003, PCT/JP03/10001.
Japanese Office Action dated Dec. 20, 2011, issued in corresponding Japanese Patent Application No. 2009-148677.
Chinese Office Action dated Feb. 6, 2009, issued in corresponding Chinese Patent Application Number 2007100964257.
Wang, Keqiang, "Theoretical Study on the Structure Property Relationships of Alkyness-Additive Properties", Journal of Guangxi University, vol. 18, No. 18m No. 2, pp. 66-71, Jun. 1993.
Notification of Transmittal of Copies of Translation of IPER and Translation of IPEA, PCT/IB/338 and PCT/IPEA/409, Date of Mailing Feb. 17, 2005.

* cited by examiner

Primary Examiner — Michael Kornakov
Assistant Examiner — Ryan Coleman
(74) Attorney, Agent, or Firm — Westerman, Hattori, Daniels & Adrian, LLP

(57) ABSTRACT

The present invention is directed to a CMP polishing slurry comprising cerium oxide particles, an organic compound having an acetylene bond (triple bond between carbon and carbon) and water, and a method for polishing a substrate which comprises a step of polishing a film to be polished of the substrate with the polishing slurry. In a CMP (chemical mechanical polishing) technique for flattening inter layer dielectrics, insulating films for shallow trench isolation and the like in a manufacturing process of semiconductor devices, the present invention enables the effective and high-speed polishing.

5 Claims, No Drawings

POLISHING SLURRY FOR CHEMICAL MECHANICAL POLISHING AND METHOD FOR POLISHING SUBSTRATE

This application is a divisional of U.S. application Ser. No. 10/524,064, filed on Feb. 8, 2005, allowed, which is a National Stage of International Application No. PCT/JP2003/10001, filed on Aug. 6, 2003.

TECHNICAL FIELD

The present invention relates to a polishing slurry for chemical mechanical polishing (CMP) which is used in processes for flattening inter layer dielectrics and achieving shallow trench isolation among production processes of semiconductor devices, and also to a method for polishing substrates.

BACKGROUND ART

Various microprocessing techniques have been studied and developed to enhance packaging density in the field of very large scale integrated circuits, and a design rule has already reached a sub-half micron order. One of techniques which can satisfy these tight microprocessing requirements is a CMP technique. This technique can perform microporocessing in a production process of semiconductor devices by completely flattening a layer to be exposed to light, and thereby can improve a product yield. Therefore, the CMP is a technique needed for flattening inter layer dielectrics, achieving shallow trench isolation, or the like.

A local oxidation method of silicon (LOCOS) has heretofore been used for isolation in an integrated circuit. More recently, however, it has been replaced with a shallow trench isolation method to decrease an isolation width. The CMP is an essential technique for the shallow trench isolation method to remove a surplus silicon oxide film formed on a wafer substrate. In order to stop polishing, a silicon nitride film is usually formed as a stopper under the silicon oxide film.

In a semiconductor device production process, an alkaline (pH: higher than 9) polishing slurry of fumed silica particles has been widely used for the CMP to flatten an insulating film of silicon oxide or the like produced by plasma CVD (chemical vapor deposition), low-pressure CVD or the like. However, a polishing slurry of silica which keeps alkaline to increase a rate of polishing a silicon oxide film polishes a silicon nitride film as a stopper also at a high rate, thereby causing problems, e.g., difficulty in uniformly polishing the wafer over the entire surface thereof (i.e., difficulty in flattening to a high extent) or occurrence of many polish scratches which can adversely affect electrical characteristics.

Recently, a polishing slurry of cerium oxide (disclosed by, e.g., Japanese Patent Laid-open Publication No. 5-326469) has been widely used as a polishing slurry for polishing glass surfaces, e.g., photomask and lens surfaces. The cerium oxide polishing slurry has advantages, i.e., polish of an silicon oxide film at a higher rate and occurrence of a relatively small number of polish scratches, as compared with a silica polishing slurry. Therefore, application of the cerium oxide polishing slurries to polishing semiconductors has been studied recently, and some of the polishing slurries have been already commercialized (e.g., Japanese Patent Laid-open Publication No. 9-270402).

However, there has not yet been developed a cerium oxide polishing slurry capable of completely flattening the entire surface of a wafer substrate on which various devices are assembled substantially without causing the polish scratches which may deteriorate electrical characteristics.

It is an object of the present invention to provide a CMP polishing slurry capable of flattening a surface to a high extent, substantially without causing polish scratches which may deteriorate electrical characteristics. It is another object of the present invention to provide a polishing method which uses the same polishing slurry.

DISCLOSURE OF THE INVENTION

The present invention is based on a fact that when a carbon-carbon triple bond of an organic compound having an acetylene bond is adsorbed on a surface to be polished, the surface can be flattened to a high extent, substantially without causing polish scratches which may deteriorate electrical characteristics.

That is to say, the present invention covers the following aspects (1) to (7).

(1) A CMP polishing slurry comprising cerium oxide particles, an organic compound having an acetylene bond and water.

(2) The CMP polishing slurry of the aspect (1), wherein the organic compound having the acetylene bond is represented by the general formula (I):

wherein $R^1$ is a hydrogen atom or a substituted or unsubstituted alkyl group of 1 to 5 carbon atoms; and $R^2$ is a substituted or unsubstituted alkyl group of 4 to 10 carbon atoms.

(3) The CMP polishing slurry of the aspect (1), wherein the organic compound having the acetylene bond is represented by the general formula (II):

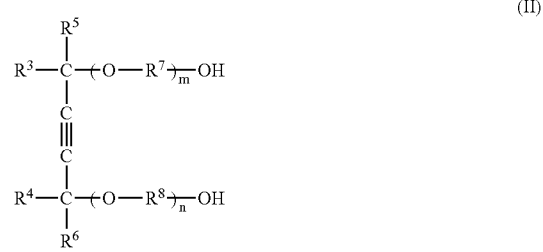

wherein $R^3$ to $R^6$ are each independently a hydrogen atom or a substituted or unsubstituted alkyl group of 1 to 5 carbon atoms; $R^7$ and $R^8$ are each independently a substituted or unsubstituted alkylene group of 1 to 5 carbon atoms; and "m" and "n" are each independently 0 or a positive number.

(4) The CMP polishing slurry of any one of the aspects (1) to (3) which further contains a water-soluble high polymer compound comprising a polymer of a vinyl compound.

(5) A method for polishing a substrate, wherein the substrate on which a film to be polished is formed is pressed under pressure against a polishing cloth on a polishing platen, and the film on the substrate and the polishing cloth are relatively moved while the CMP polishing slurry of any one of the aspects (1) to (4) is supplied between the film and the polishing cloth, thereby polishing the film.

(6) A method for polishing a substrate, wherein the substrate on which a film to be polished is formed is pressed under pressure against a polishing cloth on a polishing platen, and the film on the substrate and the polishing cloth are relatively moved while a CMP polishing slurry comprising cerium oxide particles, an organic compound having an acetylene bond and water is supplied between the film and the polishing cloth and the acetylene bond segment of the organic compound is kept adsorbed on the film, thereby polishing the film.

(7) The method of the aspect (6) for polishing a substrate, wherein the CMP polishing slurry further contains a water-soluble high polymer compound comprising a polymer of a vinyl compound.

BEST MODE FOR CARRYING OUT THE INVENTION

Cerium oxide particles are generally produced by oxidation of a cerium compound in the form of a carbonate, a nitrate, a sulfate or an oxalate. The cerium oxide particles for polishing silicon oxide films or the like produced by a TEOS-CVD method or the like are preferably from 5 to 300 nm in crystallite size, though their production process is not limited. Moreover, since the particles are used for polishing substrates in a semiconductor device production line, a content of an alkaline metal such as sodium ion or potassium ion, a halogen or sulfur in the particles is preferably limited to 10 ppm or less.

In the present invention, a process for producing the cerium oxide powder can utilize calcination, oxidation with hydrogen peroxide, or the like. A calcining temperature is preferably in a rage of 350 to 900° C.

The cerium oxide particles produced by the above process are agglomerated, and hence, they are preferably mechanically crushed by a dry method using a jet mill or a wet method using a planetary bead mill. The jet mill method is described in, e.g., Chemical Industrial Paper Collection, vol. 6, No. 5 (1980), p. 527 to 532.

The CMP polishing slurry of the present invention may be produced by, for example, adding an organic compound described later to a dispersion comprising the cerium oxide particles produced by the above method, a dispersant and water. A concentration of the cerium oxide particles is not limited, but it is preferably in a range of 0.5 to 20% by weight in the CMP polishing slurry for easy handling of the dispersant.

The polishing slurry of the present invention preferably contains a dispersant. The dispersant preferably contains at least one selected from the group consisting of water-soluble anionic, water-soluble nonionic, water-soluble cationic and water-soluble ampholytic dispersants. More preferably, it contains 2 or more dispersants. In addition, it is preferable that a content of an alkaline metal, a halogen or sulfur is limited to 10 ppm or less.

Examples of the water-soluble anionic dispersants useful for the present invention include triethanolamine lauryl sulfate, ammonium lauryl sulfate and triethanolamine polyoxyethylene alkyl ether sulfate. Anionic dispersants selected from the water-soluble high polymers described later may be also used.

Examples of the water-soluble nonionic dispersants useful for the present invention include polyoxyethylene lauryl ether, polyoxyethylene cetyl ether, polyoxyethylene stearyl ether, polyoxyethylene oleyl ether, polyoxyethylene higher alcohol ethers, polyoxyethylene octylphenyl ether, polyoxyethylene nonylphenyl ether, polyoxyalkylenealkyl ethers, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkyl amines, polyoxyethylene hydrogenated caster oil and alkyl alkanol amides.

Examples of the water-soluble cationic dispersants useful for the present invention include coconut amine acetate and stearyl amine acetate. Examples of the water-soluble ampholytic dispersants include lauryl betaine, stearyl betaine, lauryl dimethylamine oxide and 2-alkyl-N-carboxymethyl-N-hydroxyethyl imidazolinium betaines.

A content of the dispersant to be added is preferably in a range of 0.01 to 2.0 parts by weight with respect to 100 parts by weight of the cerium oxide particles from the viewpoints of dispersibility and sedimentation prevention of the particles in the slurry-like polishing slurry as well as a relationship between polish scratches and the dispersant content.

The dispersant preferably has a molecular weight of 100 to 50,000, more preferably 1,000 to 10,000. The CMP polishing slurry containing the dispersant having a molecular weight smaller than 100 may not polish the silicon oxide film or the silicon nitride film at a sufficient rate. On the other hand, the CMP polishing slurry containing the dispersant having a molecular weight larger than 50,000 may be excessively viscous and tend to deteriorate preservation stability of the CMP polishing slurry.

The cerium oxide particles can be dispersed in water by a homogenizer, an ultrasonic dispersing machine and a wet type ball mill in addition to a usual agitator.

The cerium oxide particles in the CMP polishing slurry thus produced preferably has an average size of 0.01 to 1.0 µm. The cerium oxide particles having an average size below 0.01 µm may decrease a polishing rate, and the cerium oxide particles having an average size above 1.0 µm tend to damage the polished film.

In the present invention, an average size of the cerium oxide particles is determined by a laser diffraction type particle size distribution analyzer, and in this case, the cerium oxide slurry may be diluted to an adequate concentration if necessary. A median value of the determined particle diameters is employed as the average size.

The organic compounds useful for the present invention, which have an acetylene bond, i.e., a triple bond that bonds between carbon atoms mutually by three valences, are not limited so long as they contain a triple carbon-carbon bond. More specifically, they preferably include compounds represented by the general formula (I):

$$R^1—C≡C—R^2 \qquad (I)$$

wherein $R^1$ is a hydrogen atom or a substituted or unsubstituted alkyl group of 1 to 5 carbon atoms; and $R^2$ is a substituted or unsubstituted alkyl group of 4 to 10 carbon atoms, and compounds represented by the general formula (II):

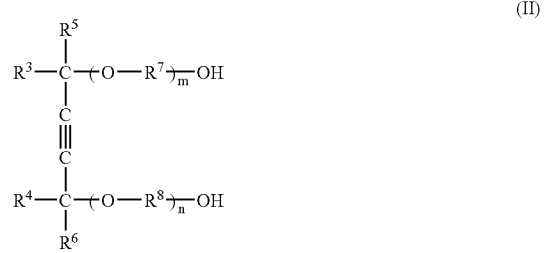

wherein $R^3$ to $R^6$ are each independently a hydrogen atom or a substituted or unsubstituted alkyl group of 1 to 5 carbon atoms; $R^7$ and $R^8$ are each independently a substituted or unsubstituted alkylene group of 1 to 5 carbon atoms; and "m"

and "n" are each independently 0 or a positive number. In the general formula (II), "m" and "n" are generally expressed with an average value, and "m+n" is preferably in a range of 2 to 20 for the purpose of improving a flattening capacity of the polishing slurry. These compounds may be used singly or in combination of two or more.

Of these compounds, more preferable are 1-decyne, 5-decyne, 2,4,7,9-tetramethyl-5-decyne-4,7-diol and 2,4,7,9-tetramethyl-5-decyne-4,7-diol ethoxylate.

A concentration of the organic compound having the acetylene bond in the CMP polishing slurry is preferably in a rage of 0.05 to 5.00% by weight to impart a sufficient flattening capacity to the polishing slurry.

It is preferable that the polishing slurry of the present invention further contains a water-soluble high polymer compound to adjust liquid properties, e.g., viscosity, pH and surface tension. A water-soluble high polymer compound comprising a polymer of a vinyl compound is particularly preferable from the viewpoint of improving the flattening capacity of the polishing slurry. More specifically, typical examples of the water-soluble high polymer compound comprising the polymer of the vinyl compound useful include polyacrylic acid, ammonium polyacrylate, amine polyacrylate, polyvinyl acetate, polyvinyl imidazole and polyvinyl pyrrolidone, and among others, polyvinyl pyrrolidone is more preferable. They may be used singly or in combination of two or more. A copolymer of vinyl pyrrolidone with at least one compound selected from the group consisting of acrylic acid, ammonium acrylate, amine acrylate, vinyl acetate and vinyl imidazole may be also used.

The water-soluble high polymer compound comprising the polymer of the vinyl compound (hereinafter referred to as the water-soluble high polymer compound) preferably has a weight-average molecular weight of 1,000 to 100,000, more preferably from 5,000 to 50,000. A concentration of the water-soluble high polymer compound in the CMP polishing slurry is preferably from 0.05 to 3.0% by weight, more preferably from 0.06 to 1.0% by weight, still more preferably from 0.07 to 0.5% by weight for the sake of securing the sufficient flattening capacity of the polishing slurry.

The polishing slurry of the present invention may be further incorporated with an additive to be commonly added to the polishing slurries, for example, a colorant such as a dye or a pigment, a pH adjustor or a solvent other than water, in addition to the components described above, within a such range as not to impair the function and effect of the polishing slurry.

The polishing slurry of the present invention may be of two-liquid type of, e.g., a solution (first liquid) containing the organic compound and preferably the water-soluble high polymer compound, and a slurry (second liquid) containing the cerium oxide particles, water and preferably a dispersant. They are separately stored and supplied to a polishing platen, on which they are mixed with each other. Another preparation procedure is mixing them with each other before the polishing stage (before they are stored or immediately before they are used for polishing), and then supplying the resultant mixture to the polishing platen. Each procedure enables the polishing slurry to provide stable polishing characteristics.

The CMP polishing slurry is preferably kept at a pH of 3 to 9, more preferably 5 to 8.5. It may have an insufficient chemical function at a pH of less than 3 to deteriorate its polishing rate. On the other hand, at a pH of more than 9, its chemical function is too strong, so that dishing might occur. The pH of the CMP polishing slurry can be adjusted with an acid or an alkali component such as ammonia or tetramethyl ammonium hydroxide (TMAH).

The polishing method of the present invention is characterized by the CMP polishing slurry of the present invention which is used for polishing a film formed on a substrate. The substrates on which the films to be polished are formed include those for use in manufacture of semiconductor devices. Typical examples of the substrates include semiconductor substrates on which at least silicon oxide films are formed, such as semiconductor substrates on which circuit elements and wiring patterns are formed, and semiconductor substrates on which circuit elements are formed. The films to be polished include an inorganic insulating film such as the silicon oxide film layer, a combination of the silicon nitride film layer and the silicon oxide film layer, and the like.

The polishing method of the present invention presses under pressure a substrate on which a film to be polished is formed to a polishing cloth on a polishing platen, and produces a relative motion between the film on the substrate and polishing cloth while supplying the CMP polishing slurry of the present invention between them to polish the film. Specifically, at least one of the substrate and the polishing platen of polishing device may be moved. Hereinafter, the polishing method of the present invention will be explained in case of the semiconductor substrate.

The semiconductor substrate can be flattened over the entire surface, when the silicon oxide or nitride film layer formed thereon is polished with the CMP polishing slurry to remove the irregularities on the surface. The polishing method of the present invention is also applicable to shallow trench isolation.

The polishing device which can be used here may be of common type having a polishing platen to which a polishing cloth (pad) can be attached and a semiconductor substrate holder. The polishing platen may be equipped with a motor of variable speed or the like. The polishing cloth on the platen is not limited, and may be a common unwoven fabric, foamed polyurethane, porous fluorine resin or the like. The polishing cloth is preferably provided with one or more grooves to hold the CMP polishing slurry. The polishing conditions are not limited. However, rotational speed of the platen is preferably low at 200 rpm or less to prevent the semiconductor substrate from being run out, and pressure (polishing pressure) on the semiconductor substrate is preferably around 98 kPa (1 kg/cm$^2$) or less to prevent polish scratches. The polishing slurry of the present invention is continuously supplied in the form of slurry between the film and polishing cloth by a pump or the like while polishing the film. A feed rate of the polishing slurry is not limited, but it is preferably supplied in such a way to keep the polishing cloth surface covered with the polishing slurry.

In order to achieve global flattening for a film to be polished (silicon oxide film) with irregularities on the surface, it is necessary to selectively remove the convex parts. The CMP polishing slurry of the present invention contains the organic compound whose acetylene bond segment is adsorbed on the film to be polished. When the film is polished with the acetylene bond segment adsorbed thereon, the convex parts on the surface are selectively removed to achieve flattening to a high extent. When the polishing slurry further contains the water-soluble high polymer compound comprising the polymer of the vinyl compound, flattening is more improved.

The polished semiconductor substrate is preferably well washed in a flow of water and treated by a spin drier or the like to remove water droplets from the substrate before being dried.

The substrate treated by the above procedure to have flattened shallow trenches is provided with a wiring, e.g., of aluminum, on the insulating film layer of silicon oxide, and is further treated to have insulating films of silicon oxide between and on the wires. Then, it is polished with the CMP polishing slurry in a similar manner, to remove irregularities on the inorganic insulating film surface and thereby to have flattened surface over the entire semiconductor substrate. A desired number of the layers can be provided by repeating the above procedure as desired times as required.

The inorganic insulating film to which the polishing slurry or polishing method of the present invention is applied may be produced by low-pressure CVD, plasma CVD or the like. The low-pressure CVD method for producing a silicon oxide film uses monosilane ($SiH_4$) as the Si source and oxygen ($O_2$) as the oxygen source. The film is produced by the $SiH_4$—$O_2$ oxidation effected at a low temperature of 400° C. or lower, where the CVD-produced film may be thermally treated at 1000° C. or lower in some cases. When it is doped with phosphorus (P) for surface-flattening by reflow at high temperature, a preferable reaction gas is a mixture of $SiH_4$—$O_2$—$PH_3$.

The plasma CVD method allows the chemical reaction to proceed at low temperature, and has an advantage over the common chemical reaction which needs a higher temperature under a thermal equilibrium. Plasma is generated by capacitive or inductive coupling. The reaction gases include $SiH_4$—$N_2O$ with $SiH_4$ as the Si source and $N_2O$ as the oxygen source, and tetraethoxysilane (TEOS) —$O_2$ with TEOS as the Si source (for TEOS-plasma CVD). The preferable conditions are substrate temperature: 250 to 400° C. and reaction pressure: 67 to 400 Pa. As discussed above, the silicon oxide film to which the polishing slurry or polishing method of the present invention is applied may be doped with an element such as phosphorus or boron. Similarly, low-pressure CVD for producing the silicon nitride film uses dichlorosilane ($SiH_2Cl_2$) as the Si source and ammonia ($NH_3$) as the nitrogen source. The film is produced by carrying out the $SiH_2Cl_2$—$NH_3$ system oxidative reaction at a high temperature of 900° C. Plasma CVD uses a mixed reaction gas of $SiH_4$—$NH_3$ serving $SiH_4$ as the Si source and $NH_3$ as the nitrogen source. The substrate is preferably kept at 300 to 400° C.

The polishing slurry and polishing method of the present invention are applicable not only to polishing a silicon oxide film formed on a semiconductor substrate but also to polishing others, including inorganic insulating films, e.g., silicon oxide film formed on a wiring board having a given wiring, glass and silicon nitride; films mainly comprising polysilicon, Al, Cu, Ti, TiN, W, Ta or TaN; optical glass, e.g., photomask, lens and prism; inorganic electroconductive films, e.g., ITO film; glass and crystal materials for optical ICs, optical switching devices and optical waveguides; edges of optical fibers; optical single-crystal devices, e.g., scintillators; solid laser single-crystal devices; sapphire substrates for blue-color LEDs; semiconducting single crystals, e.g., SiC, GaP and GaAs; and glass substrates for magnetic disks and magnetic heads.

EXAMPLES

Next, the present invention will be described referring to examples and a comparative example, which by no means limit the present invention.

Example 1

(Preparation of Cerium Oxide Slurry)

Cerium oxide powder was prepared by calcining 2 kg of cerium carbonate hydrate put in an alumina container at 850° C. for 2 hours in air. Then, 1 kg of the thus prepared cerium oxide particles, 23 g of an aqueous solution of ammonium polyacrylate (40% by weight) and 8,977 g of deionized water were mixed with each other, and the mixture was subjected to supersonic dispersion with stirring for 10 minutes to prepare a slurry. The resulting slurry was filtered through a 1 μm filter, and deionized water was then added thereto, thereby preparing the slurry containing cerium oxide at 5.0% by weight.

(Preparation of CMP Polishing Slurry)

1,000 g of the above cerium oxide slurry, 15 g of 2,4,7,9-tetramethyl-5-decyne-4,7-diol ethoxylate (reagent made by Aldrich Co., Ltd., "m+n" in the general formula (II) is 3.5) as an organic compound having an acetylene bond and 1,985 g of water were mixed with each other to prepare a CMP polishing slurry containing 0.5% by weight of the organic compound having the acetylene bond and 1.67% by weight of cerium oxide particles (the polishing slurry is hereinafter referred to as the CMP polishing slurry (1)). A pH of the CMP polishing slurry (1) was 8.4.

(Polishing of an Insulating Film Layer and a Shallow Trench Isolation Layer)

On an Si substrate of 8 inches (20.3 cm) in diameter, an Al wiring line segment having a line/space width of 0.05 to 5 mm and a height of 1,000 nm was formed, and a 2,000 nm thick silicon oxide film was then formed on the segment by a TEOS-plasma CVD method to prepare an insulating film layer pattern wafer.

This insulating film layer pattern wafer (hereinafter referred to as the wafer (1)) was set on a holder of a polishing device (polishing device made by Ebara Corporation: EPO111). The holder was set on a polishing platen of the polishing device after it was provided with a polishing pad (polishing cloth) of porous urethane resin, with the silicon oxide film (insulation film) surface of the wafer down.

The insulating film was polished for 3 minutes with the thus prepared CMP polishing slurry (1) which was supplied between the film and the polishing cloth (platen rotational speed: 80 rpm, head rotational speed: 80 rpm, polishing load: 20 kPa, and polishing slurry supply rate: 200 mL/minute). As a result, the polished insulating film was highly flattened to such a degree that a difference between a convex top and a concave bottom was 40 nm.

Two types of wafers (2A and 2B) were prepared by forming a silicon oxide film on an 8-inch wafer in accordance with a plasma CVD method, and by forming a silicon nitride film on a wafer having the same diameter in accordance with a low-pressure plasma CVD method, respectively.

The silicon oxide film on the wafer 2A and the silicon nitride film on the wafer 2B were polished with the CMP polishing slurry (1) for 1 minute (platen rotational speed: 80 rpm, head rotational speed: 80 rpm, polishing load: 20 kPa, and polishing slurry supply rate: 200 mL/minute). A film thickness was determined before and after the polishing by a light interference type film thickness meter to calculate a polishing rate. As a result, the polishing rate of the silicon oxide film on the wafer (2A) was 220 nm/minute, and that of the silicon nitride film on the wafer (2B) was 52 nm/minute. A polishing rate ratio was 4.2. The polished silicon oxide film on the wafer (2A) was analyzed by the use of a wafer scratch detector (Surfscan 6220 made of KLA-Tencor Corporation) and a microscope for observing a wafer outer appearance (AL-2000 made of Olympus Optical Co., Ltd.) to count the number of polish scratches of 0.2 μm or more in size. As a result, it was 15 scratches/wafer.

On an 8-inch Si substrate, there were formed 350 nm to 0.1 mm (one side) square convex parts and 400 nm deep concave parts to prepare an isolated shallow trench pattern wafer having a convex part density of 2 to 40%. The convex parts were coated with a 100 nm thick silicon nitride film, and then, on the silicon nitride film, a 600 nm thick silicon oxide film was formed by a TEOS-plasma CVD method (hereinafter referred to as the patterned wafer (3)). This patterned wafer (3) was polished with the CMP polishing slurry (1) for 2 minutes (platen rotational speed: 80 rpm, head rotational speed: 80 rpm, polishing load: 20 kPa, and polishing slurry supply rate: 200 mL/minute). As a result, the patterned wafer (3) was highly flattened to such a degree that a difference between a convex top and a concave bottom was 40 nm.

Example 2

(Preparation of CMP Polishing Slurry)
750 g of the cerium oxide slurry mentioned in Example 1, 50 g of 2,4,7,9-tetramethyl-5-decyne-4,7-diol ethoxylate (the above-mentioned reagent made by Aldrich Co., Ltd.) and 4,200 g of water were mixed with each other to prepare a CMP polishing slurry containing 1.0% by weight of an organic compound having an acetylene bond and 0.75% by weight of cerium oxide particles (the polishing slurry is hereinafter referred to as the CMP polishing slurry (2)). A pH of the CMP polishing slurry (2) was 8.4.
(Polishing of an Insulating Film Layer and a Shallow Trench Isolation Layer)
A wafer (1) was polished for 3 minutes with the above CMP polishing slurry (2) (polishing device made by Ebara Corporation: EPO111, platen rotational speed: 50 rpm, head rotational speed: 50 rpm, polishing load: 30 kPa, and polishing slurry supply rate: 200 mL/minute). As a result, the wafer (1) was highly flattened to such a degree that a difference between a convex top and a concave bottom was 40 nm.

A silicon oxide film and a silicon nitride film of wafers (2A, 2B) were polished with the CMP polishing slurry (2) under the same conditions as in the case of the wafer (1) except for a polishing time was 1 minute. As a result, a polishing rate of the silicon oxide film was 290 nm/minute, and that of the silicon nitride film was 68 nm/minute. A polishing rate ratio was 4.26. For the polished silicon oxide film, the number of polish scratches of 0.2 μm or more in size was counted in the same manner as in Example 1. As a result, it was 15 scratches/wafer.

The patterned wafer (3) was polished with the CMP polishing slurry (2) for 3 minutes under the same conditions as in the case of the wafer (1). As a result, the patterned wafer (3) was highly flattened to such a degree that a difference between a convex top and a concave bottom was 50 nm.

Example 3

(Preparation of CMP Polishing Slurry)
750 g of the cerium oxide slurry mentioned in Example 1, 50 g of 2,4,7,9-tetramethyl-5-decyne-4,7-diol ethoxylate (the above-mentioned reagent made by Aldrich Co., Ltd.), 3.75 g of polyvinyl pyrrolidone (Tokyo Kasei Kogyo Co., Ltd., K 30; weight-average molecular weight: 40,000) and 4,196.25 g of deionized water were mixed with each other to prepare a CMP polishing slurry containing 1.0% by weight of an organic compound having an acetylene bond, 0.75% by weight of cerium oxide particles and 0.075% by weight of polyvinyl pyrrolidone (the polishing slurry is hereinafter referred to as the CMP polishing slurry (3)). A pH of the CMP polishing slurry (3) was 8.40.
(Polishing of an Insulating Film Layer and an Shallow Trench Isolation Layer)
A wafer (1) was polished for 3 minutes with the above CMP polishing slurry (3) under the same conditions as in case of the wafer (1) of Example 2. As a result, the wafer (1) was highly flattened to such a degree that a difference between a convex top and a concave bottom was 20 nm.

A silicon oxide film and a silicon nitride film of wafers (2A, 2B) were polished for 1 minute with the CMP polishing slurry (3) under the same conditions as in the case of the wafers (2A, 2B) of Example 2. As a result, a polishing rate of the silicon oxide film was 50 nm/minute, and that of the silicon nitride film was 65 nm/minute. A polishing rate ratio was 0.77. For the polished silicon oxide film, the number of polish scratches of 0.2 μm or more in size was counted in the same manner as in Example 1. As a result, it was 15 scratches/wafer.

A patterned wafer (3) was polished with the CMP polishing slurry (3) under the same conditions as in the case of the wafer (3) of Example 2 except that a polishing time was 200 seconds. As a result, the patterned wafer (3) was highly flattened to such a degree that a difference between a convex top and a concave bottom was 10 nm.

Comparative Example 1

(Preparation of CMP Polishing Slurry)
The cerium oxide slurry mentioned in Example 1 was diluted 3 times with deionized water (cerium oxide particles concentration: 1.67% by weight) to prepare a CMP polishing slurry to which an organic compound mentioned in Example 1 was not added. A pH of this polishing slurry was 7.0.
(Polishing of an Insulating Film Layer and a Shallow Trench Isolation Layer)
A wafer (1), wafer (2A, 2B) and a patterned wafer (3) were polished for 3 minutes, 1 minute and 2 minutes, respectively, under the same conditions as in case of Example 1 except that the above CMP polishing slurry (cerium oxide particles: 1.67% by weight) was used. As a result, in the polished wafer (1), a difference between a convex top and a concave bottom was 150 nm, which indicated that flattening properties were noticeably poor. Furthermore, for a polished silicon oxide film of the wafer (2A), the number of polish scratches of 0.2 μm or more in size was counted in the same manner as in Example 1. As a result, it was 30 scratches/wafer. In the polished patterned wafer (3), a difference between a convex top and a concave bottom was 150 nm, which indicated that properties were poor.

INDUSTRIAL APPLICABILITY

According to a CMP polishing slurry and a polishing method of substrates of the present invention, surfaces to be polished can highly be flattened, and these techniques are suitable for a manufacturing process of semiconductor devices, for example, shallow trench isolation. In addition, the techniques can highly polish the surfaces of silicon oxide insulating films and the like without scratches thereon.

The invention claimed is:
1. A method for polishing, comprising
  forming a film to be polished with irregularities on a surface including a silicon oxide film,
  preparing a CMP polishing slurry, and
  moving the film and a polishing cloth on a polishing platen relatively in the presence of the CMP polishing slurry, thereby polishing the film
  wherein said preparing the CMP polishing slurry comprises
  (i) preparing a cerium oxide slurry containing
    (a) cerium oxide particles, (e) dispersant and (d) water and

(ii) mixing with the cerium oxide slurry (b) a water-soluble high polymer compound selected from the group consisting of polyacrylic acid, ammonium polyacrylate, amine polyacrylate, polyvinyl acetate, polyvinyl imidazole and polyvinyl pyrrolidone in an amount to give a concentration of 0.05 to 3.0% by weight to the CMP polishing slurry and (c) an organic compound having an acetylene bond represented by the general formula in an amount to give a concentration of 0.05 to 5.00% by weight to the CMP polishing slurry:

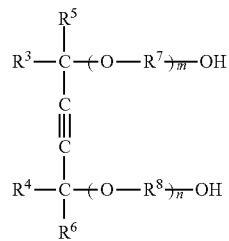

wherein $R^3$ to $R^6$ are each independently a hydrogen atom or a substituted or unsubstituted alkyl group of 1 to 5 carbon atoms; $R^7$ and $R^8$ are each independently a substituted or unsubstituted alkylene group of 1 to 5 carbon atoms; and "m" and "n" are each independently 0 or a positive number and m+n is in the range of 2 to 20, thereby obtaining the CMP polishing slurry
wherein a pH of the CMP polishing slurry is 5 to 8.5.

2. The method according to claim 1, comprising preparing the CMP polishing slurry from
a liquid (first liquid) containing the organic compound and the water-soluble high polymer compound and
the cerium oxide slurry (second liquid) containing the cerium oxide particles, the dispersant and water,
wherein the liquid and the cerium oxide slurry are supplied to the polishing platen where they are mixed with each other,
or the liquid and the cerium oxide slurry are mixed with each other before the polishing and then supplied to the polishing platen.

3. The method for polishing according to claim 1, comprising making the CMP polishing slurry from
a solution (first liquid) containing the organic compound and the water-soluble high polymer compound, and
the cerium oxide slurry (second liquid) containing the cerium oxide particles, the dispersant and water.

4. The method according to claim 2, wherein the liquid and the cerium oxide slurry are supplied to the polishing platen where they are mixed with each other.

5. The method according to claim 2, wherein the liquid and the cerium oxide slurry are mixed with each other before the polishing and then supplied to the polishing platen.

* * * * *